US012543370B2

(12) United States Patent
Lee (10) Patent No.: US 12,543,370 B2
(45) Date of Patent: Feb. 3, 2026

(54) THIN-FILM TRANSISTOR ARRAY SUBSTRATE WITH CONNECTION NODE AND DISPLAY DEVICE INCLUDING THE SAME

(71) Applicant: Samsung Display Co., Ltd., Yongin-si (KR)

(72) Inventor: Won-Se Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/652,847

(22) Filed: Feb. 28, 2022

(65) Prior Publication Data

US 2022/0181360 A1   Jun. 9, 2022

Related U.S. Application Data

(63) Continuation of application No. 15/946,697, filed on Apr. 5, 2018, now Pat. No. 11,264,412, which is a
(Continued)

(30) Foreign Application Priority Data

Aug. 24, 2012   (KR) .................. 10-2012-0093295

(51) Int. Cl.
*H10D 86/40*   (2025.01)
*H10D 86/60*   (2025.01)
(Continued)

(52) U.S. Cl.
CPC ......... *H10D 86/441* (2025.01); *H10D 86/451* (2025.01); *H10D 86/481* (2025.01);
(Continued)

(58) Field of Classification Search
CPC ............... H01L 27/1214; H01L 27/124; H01L 27/1248; H01L 27/1255; H10K 59/121;
(Continued)

(56) References Cited

U.S. PATENT DOCUMENTS 7,118,947 B2   10/2006   Yoo et al.
7,521,715 B2   4/2009    Jang et al.
(Continued)

FOREIGN PATENT DOCUMENTS

CN   1614485 A   5/2005
CN   1641882 A   7/2005
(Continued)

OTHER PUBLICATIONS

KIPO Office action dated Dec. 2, 2013, for Korean priority Patent application 10-2012-0093295, (5 pages).
(Continued)

*Primary Examiner* — Marcos D. Pizarro
(74) *Attorney, Agent, or Firm* — Womble Bond Dickinson (US) LLP (57) ABSTRACT

A thin-film transistor (TFT) array substrate including: a first conductive layer selected from an active layer, a gate electrode, a source electrode, and a drain electrode of a TFT; a second conductive layer in a layer different from the first conductive layer; and a connection node coupling the first conductive layer to the second conductive layer. Here, the TFT array has a node contact hole formed by: a first contact hole in the first conductive layer; and a second contact hole in the second conductive layer, the second contact hole being integral with the first contact hole and not being separated from the first contact hole by an insulating layer, and at least a portion of the connection node is in the node contact hole.

12 Claims, 9 Drawing Sheets

Related U.S. Application Data continuation of application No. 14/838,036, filed on Aug. 27, 2015, now Pat. No. 9,941,307, which is a continuation of application No. 13/794,407, filed on Mar. 11, 2013, now Pat. No. 9,136,316.

(51) Int. Cl.
*H10K 59/121* (2023.01)
*H10K 59/131* (2023.01)

(52) U.S. Cl.
CPC ......... *H10D 86/60* (2025.01); *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131; H10D 86/441; H10D 86/451; H10D 86/481; H10D 86/60
See application file for complete search history.

(56) References Cited

U.S. PATENT DOCUMENTS

| | | |
|---|---|---|
| 7,799,594 B2 | 9/2010 | You |
| 8,085,352 B2 | 12/2011 | Kim et al. |
| 8,111,221 B2 | 2/2012 | Ono |
| 8,222,638 B2 | 7/2012 | Choi |
| 8,698,153 B2 | 4/2014 | Misaki |
| 8,797,318 B2 | 8/2014 | Yoo et al. |
| 9,053,985 B2 | 6/2015 | Tanaka et al. |
| 9,136,316 B2 | 9/2015 | Lee |
| 2002/0054247 A1 | 5/2002 | Hwang et al. |
| 2002/0104995 A1* | 8/2002 | Yamazaki ............ H10K 59/122 257/E27.113 |
| 2003/0151568 A1 | 8/2003 | Ozawa |
| 2004/0266165 A1 | 12/2004 | Utsunomiya |
| 2005/0062057 A1 | 3/2005 | Yamazaki et al. |
| 2005/0078264 A1 | 4/2005 | Yoo et al. |
| 2005/0092995 A1 | 5/2005 | Yoo et al. |
| 2005/0151276 A1 | 7/2005 | Jang et al. |
| 2005/0179379 A1 | 8/2005 | Kim |
| 2006/0139554 A1 | 6/2006 | Park |
| 2006/0267491 A1 | 11/2006 | Koo et al. |
| 2007/0171115 A1 | 7/2007 | Kim et al. |
| 2008/0029768 A1 | 2/2008 | Asano et al. |
| 2008/0062092 A1 | 3/2008 | Kanda |
| 2008/0246026 A1 | 10/2008 | Kim |
| 2009/0162961 A1 | 6/2009 | Deane |
| 2010/0051910 A1 | 3/2010 | Choi |
| 2012/0026144 A1 | 2/2012 | Kang et al. |
| 2012/0091461 A1* | 4/2012 | Kim ................... H10D 30/6713 257/E21.414 |
| 2012/0229438 A1 | 9/2012 | Fujita |
| 2017/0194359 A1 | 7/2017 | Saito et al. |

FOREIGN PATENT DOCUMENTS

| | | | |
|---|---|---|---|
| CN | 101667572 A | | 3/2010 |
| CN | 102150196 A | | 8/2011 |
| CN | 102387391 A | | 3/2012 |
| CN | 203553169 U | | 4/2014 |
| EP | 2 587 472 A1 | | 5/2013 |
| JP | 05-299600 A | | 11/1993 |
| JP | 2000-267595 A | | 9/2000 |
| JP | 2000-357735 A | | 12/2000 |
| JP | 2004272293 A | * | 9/2004 |
| JP | 2005-165286 A | | 6/2005 |
| JP | 2005-235765 A | | 9/2005 |
| JP | 2008-235499 A | | 10/2008 |
| JP | 2009-037115 A | | 2/2009 |
| JP | 2011-258976 | | 12/2011 |
| KR | 10-2007-0074826 A | | 7/2007 |
| KR | 10-2009-0041284 A | | 4/2009 |
| KR | 10-2011-0036378 A | | 4/2011 |
| KR | 10-1056233 B1 | | 8/2011 |
| WO | WO 2011/162242 A1 | | 12/2011 |
| WO | WO 2012/008192 A1 | | 1/2012 |

OTHER PUBLICATIONS

KIPO Registration Determination Certificate dated May 20, 2014, for Korean priority Patent application 10-2012-0093295, (2 pages).
EPO Search Report dated Nov. 15, 2013, for corresponding European Patent application 13181602.7, (5 pages).
EPO Office Action dated Nov. 15, 2017, for corresponding European Patent Application No. 13181602.7 (7 pages).
Office action dated Dec. 31, 2021, issued in corresponding Chinese Patent Application No. 201810360491.9.

* cited by examiner

THIN-FILM TRANSISTOR ARRAY SUBSTRATE WITH CONNECTION NODE AND DISPLAY DEVICE INCLUDING THE SAME

CROSS-REFERENCE TO RELATED PATENT APPLICATION

This application is a continuation of U.S. patent application Ser. No. 15/946,697, filed Apr. 5, 2018, now U.S. Pat. No. 11,264,412, which is a continuation of U.S. patent application Ser. No. 14/838,036, filed Aug. 27, 2015, now U.S. Pat. No. 9,941,307, which is a continuation of U.S. patent application Ser. No. 13/794,407, filed Mar. 11, 2013, now U.S. Pat. No. 9,136,316, which claims priority to and the benefit of Korean Patent Application No. 10-2012-0093295, filed on Aug. 24, 2012, the entire content of all of which is incorporated herein by reference.

BACKGROUND

1. Field

Aspects of the present invention relate to a thin-film transistor array substrate and a display device including the thin-film transistor array substrate.

2. Description of the Related Art

A display device, such as an organic light-emitting display device and a liquid crystal display device, may include a thin-film transistor (TFT), a capacitor, and wires coupling the TFT and the capacitor.

The display device may be manufactured by forming a minute pattern of the TFT, the capacitor, and the wires on a substrate, and the display device operates by a complex connection between the TFT, the capacitor, and the wires.

With the increasing demand for compact and high resolution displays, an efficient space arrangement and connection structure between the TFT, the capacitor, and the wires included in the display device are increasingly desired.

SUMMARY

One or more embodiments of the present invention include a thin-film transistor array substrate and a display device including the thin-film transistor array substrate having an efficient space arrangement and connection structure.

According to an aspect of the present invention, there is provided a thin-film transistor (TFT) array substrate including: a first conductive layer selected from an active layer, a gate electrode, a source electrode, and a drain electrode of a TFT; a second conductive layer in a layer different from the first conductive layer; and a connection node coupling the first conductive layer to the second conductive layer. Here, the TFT array has a node contact hole formed by: a first contact hole in the first conductive layer; and a second contact hole in the second conductive layer, the second contact hole being integral with the first contact hole and not being separated from the first contact hole by an insulating layer, and at least a portion of the connection node is in the node contact hole.

The connection node may be in a layer different from the first conductive layer and the second conductive layer.

The first conductive layer and the second conductive layer may partially overlap at a region in which the node contact hole is located.

According to one or more embodiments of the present invention, a bank of the insulation layer is not located between the first contact hole and the second contact hole.

The first conductive layer or the second conductive layer may be in a same layer as the active layer.

The first conductive layer or the second conductive layer may include a same material as the active layer.

The insulation layer may include: a first insulation layer between the first conductive layer and the second conductive layer; and a second insulation layer between the connection node and an upper one of the first conductive layer or the second conductive layer. The second insulation layer may not be located at a region where the first conductive layer and the second conductive layer partially overlap at a region where the node contact hole is located.

According to another embodiment of the present invention, a display apparatus includes: a plurality of pixels each including: a pixel circuit coupled to a plurality of wires and including at least one TFT and at least one capacitor; and a display device coupled to the pixel circuit; a first conductive layer in the pixels and selected from an active layer, a gate electrode, a source electrode, and a drain electrode of a TFT; a second conductive layer in the pixels, partially overlapping with the first conductive layer, and in a layer different from the first conductive layer; and a connection node coupling the first conductive layer and the second conductive layer. Here, the display apparatus has a node contact hole that is formed by: a first contact hole in the first conductive layer; and a second contact hole in the second conductive layer, the second contact hole being integral with the first contact hole and not being separated from the first contact hole by an insulating layer, and at least a portion of the connection node is in the node contact hole.

The connection node may be in a layer different from the first conductive layer and the second conductive layer.

The first conductive layer and the second conductive layer may partially overlap at a region in which the node contact hole is located.

According to one or more embodiments of the present invention, a bank of the insulation layer is not located between the first contact hole and the second contact hole.

The second conductive layer may include an electrode of the capacitor.

The second conductive layer may include a layer extending from the plurality of wires.

The connection node may be on a same layer as a data wire of the plurality of wires that provides the pixel circuit with a data signal.

The first conductive layer or the second conductive layer may be in a same layer as the active layer. The first conductive layer or the second conductive layer may include a same material as the active layer. The first conductive layer or the second conductive layer may include doped polysilicon.

The insulation layer may include: a first insulation layer between the first conductive layer and the second conductive layer; and a second insulation layer between the connection node and an upper one of the first conductive layer and the second conductive layer. The second insulation layer may not be located at a region where the first conductive layer and the second conductive layer partially overlap at a region where the node contact hole is located.

The display device may include an organic light-emitting diode (OLED) including a first electrode, a second electrode, and an emissive layer between the first electrode and the second electrode.

A planarization layer may be between the OLED and the connection node.

According to yet another embodiment of the present invention, a display apparatus includes: a plurality of pixels each including: a pixel circuit coupled to a plurality of wires and including at least one TFT and at least one capacitor; and a display device coupled to the pixel circuit; a first conductive layer in the plurality of pixels; a second conductive layer in the plurality of pixels, partially overlapping with the first conductive layer, and in a layer different from the first conductive layer; and a connection node coupling the first conductive layer to the second conductive layer. Here, the display apparatus has a node contact hole formed by: a first contact hole in the first conductive layer; and a second contact hole in the second conductive layer, the second contact hole being integral with the first contact hole and not being separated from the first contact hole by an insulating layer, and at least a portion of the connection node is in the node contact hole.

The first conductive layer may be selected from an active layer, a gate electrode, a source electrode, and a drain electrode of the at least one TFT.

The display device may include an OLED including a first electrode, a second electrode, and an emissive layer between the first electrode and the second electrode.

A planarization layer may be between the OLED and the connection node.

BRIEF DESCRIPTION OF THE DRAWINGS

The above and other features and aspects of the present invention will become more apparent from the following detailed description of embodiments of the present invention with reference to the attached drawings, in which.

DETAILED DESCRIPTION

In the following detailed description, only certain exemplary embodiments of the present invention have been shown and described. As those skilled in the art would realize, the described embodiments may be modified in various different ways, all without departing from the spirit or scope of the present invention. Accordingly, the drawings and description are to be regarded as illustrative in nature and not restrictive.

Like reference numerals designate like elements throughout the specification. In various embodiments, the elements having the same construction are representatively described in a first embodiment by using the same reference numeral, and constructions different from that described in the first embodiment are described in the other embodiments.

Sizes and thicknesses of the elements shown in the drawings are for the purpose of descriptive convenience, and thus, the present invention is not necessarily limited thereto. Thicknesses of layers and regions may be expanded in the drawings for clarity. When an element such as a layer, a film, a region, or a board is referred to as being "on" another element, the element can be directly on the another element or one or more intervening elements may be interposed therebetween. In addition, when an element is referred to as being "coupled" (e.g., electrically coupled or connected) to another element, it may be directly coupled to the another element or be indirectly coupled to the another element with one or more intervening elements interposed therebetween.

Throughout this specification, unless explicitly described to the contrary, the word "comprise" and variations such as "comprises" or "comprising", will be understood to imply the inclusion of stated elements but not the exclusion of any other elements. Further, throughout this specification, the term "above" encompasses both an orientation of above and below and does not necessarily encompass the orientation of above with respect to a direction of gravity.

Although an active matrix (AM) organic light-emitting display (OLED) device having a 2Tr-1Cap structure, which includes two thin film transistors (TFTs) and one capacitor in a single pixel, and an AMOLED device having a 6Tr-sCap structure, which includes six TFTs and two capacitors, are illustrated in the accompanying drawings, the present invention is not limited thereto. Thus, the OLED device may include a plurality of TFTs and one or more capacitors in a single pixel, and may have a variety of structures in which wires are additionally formed or existing wires are omitted. In this regard, a pixel refers to a minimum unit used to display an image. The OLED device displays an image through a plurality of pixels.

The OLED device according to a first embodiment of the present invention will now be described with reference to FIGS. 1 through 4.

Figure 1:
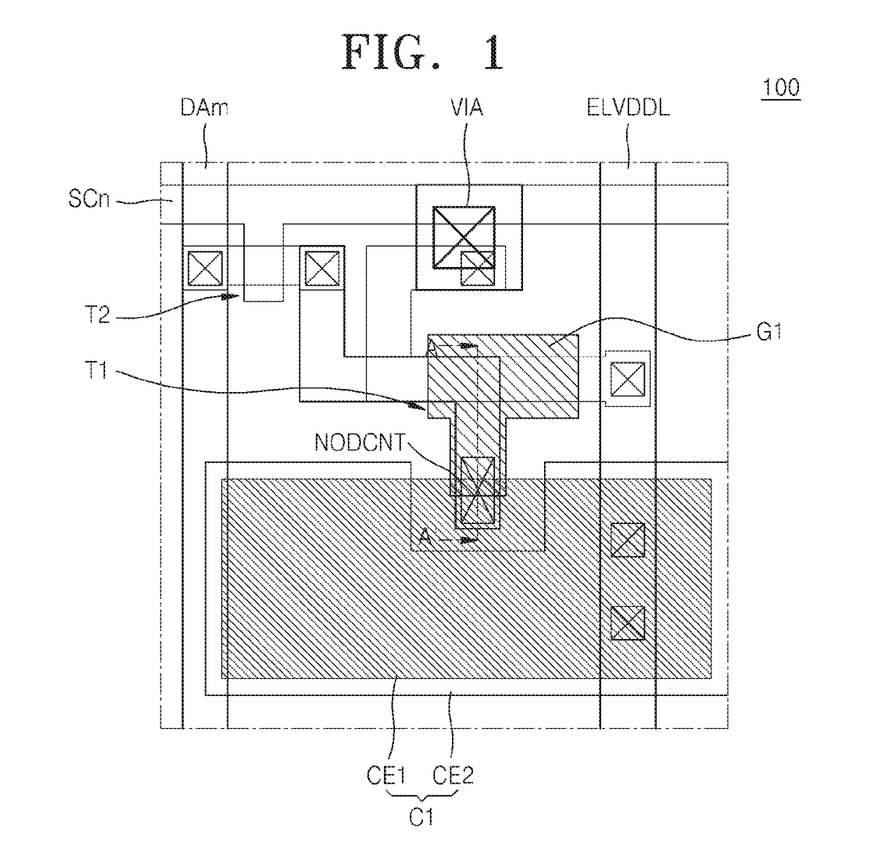
FIG. 1 is a schematic plan view of a pixel of an organic light-emitting display (OLED) device according to a first embodiment of the present invention.
Figure 2:
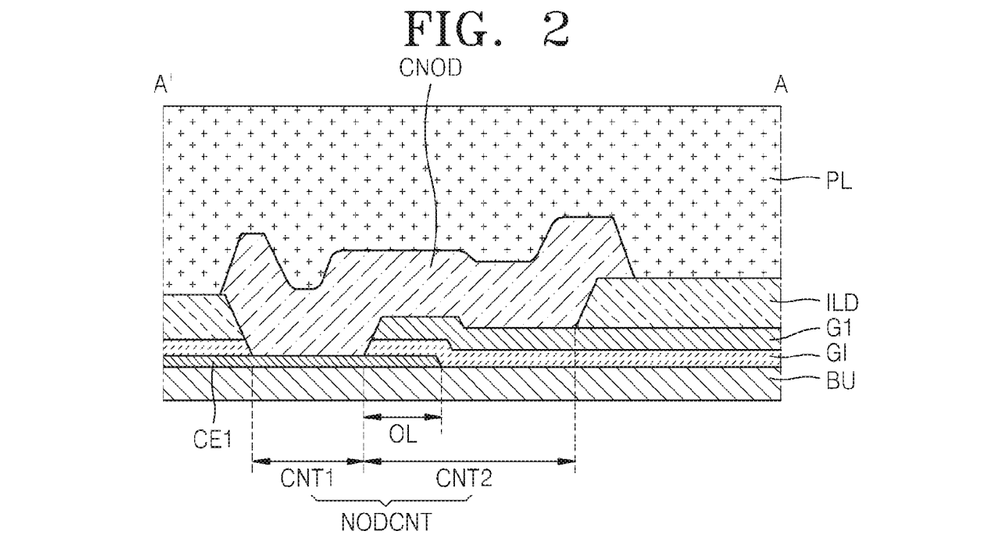
FIG. 2 is a schematic cross-sectional view taken from the line A-A' of FIG. 1.
Figure 3:
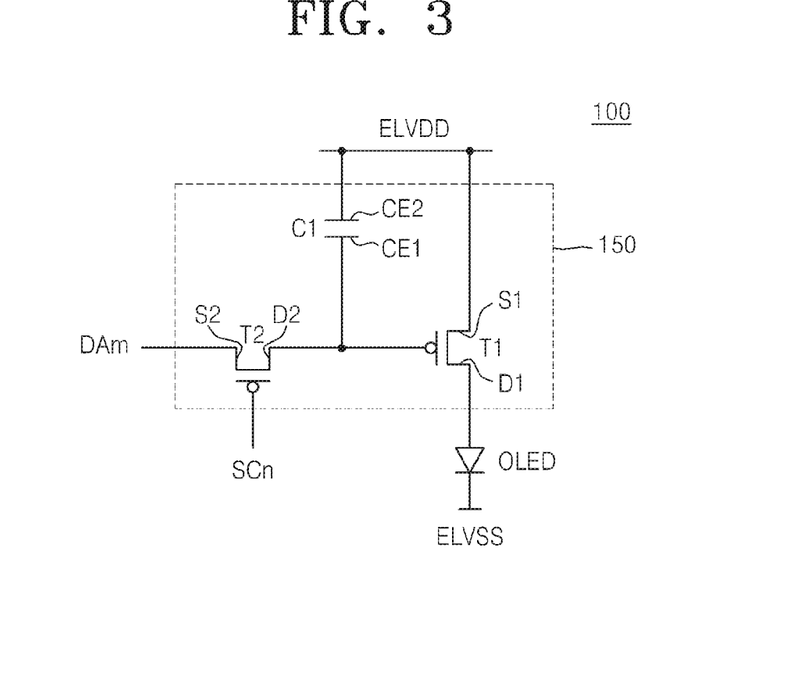
FIG. 3 is a circuit diagram of the pixel of FIG. 1.
Figure 4:
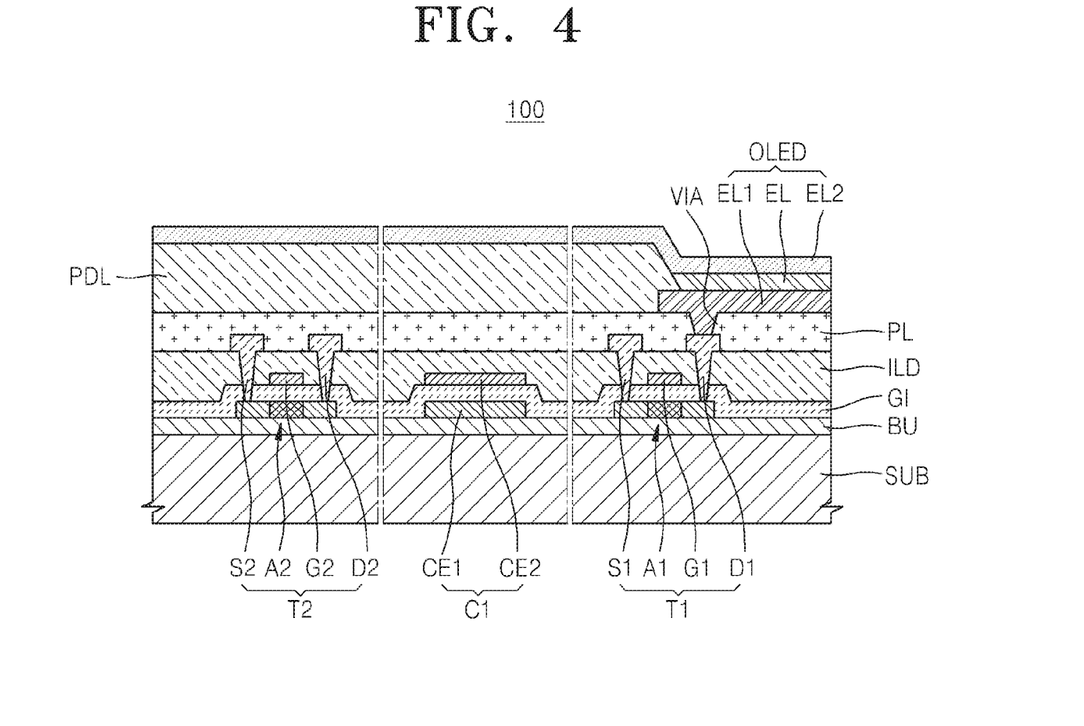
FIG. 4 is a cross-sectional diagram of the pixel of FIG. 1.

FIG. 1 is a schematic plan view of a pixel of an OLED device according to a first embodiment of the present invention. FIG. 2 is a schematic cross-sectional view taken from the line A-A' of FIG. 1. FIG. 3 is a circuit diagram of the pixel of FIG. 1. FIG. 4 is a cross-sectional diagram of the pixel of FIG. 1.

As shown in FIGS. 1 through 4, the pixel 100 of the organic light-emitting display device according to a first embodiment of the present invention includes two TFTs and one capacitor.

The pixel 100 includes an organic light-emitting device (OLED) that is coupled between a first power source ELVDD and a second power source ELVSS, and a pixel circuit 150 that is coupled between the first power source ELVDD and the OLED and controls a driving power supplied to the OLED.

An anode electrode EL1 of the OLED is coupled to a driving power line ELVDDL, which is coupled to the first power source ELVDD via the pixel circuit 150. A cathode electrode EL2 of the OLED is coupled to the second power source ELVSS. The OLED emits light at a brightness corresponding to a driving current that flows through the OLED when the driving power is supplied from the first power source ELVDD through the pixel circuit 150 and a common power is supplied from the second power source ELVSS.

The pixel circuit 150 may include a first TFT T1, a second TFT T2, and a first capacitor C1.

The first TFT T1 is coupled between the driving power line ELVDDL and the OLED and supplies the driving power corresponding to a data signal from the first power source ELVDD to the OLED during a light emitting period of the pixel 100. That is, the first TFT T1 functions as a driving transistor of the pixel 100. The first TFT T1 includes a first active layer A1, a first gate electrode G1, a first source electrode S1, and a first drain electrode D1.

The first active layer A1 may include polysilicon, and may include a source region and a drain region, which are doped with a doping material, and a channel region between the source region and the drain region. The first active layer A1 is located between a buffer layer BU and a gate insulation layer GI that are on (e.g., formed on) a substrate SUB.

The first gate electrode G1 of the first TFT T1 is located (or disposed) between the gate insulation layer GI and an interlayer insulation layer ILD. The first gate electrode G1 may be coupled to the first capacitor electrode CE1 of the first capacitor C1 neighboring the first gate electrode G1 through a connection node CNOD in (e.g., formed in) the node contact hole NODCNT. The first source electrode S1 of the first TFT T1 may be coupled to the driving power line ELVDDL, and the first drain electrode D1 of the first TFT T1 may be coupled to the anode electrode EL1 of the OLED.

The second TFT T2 is coupled between a data line DAm and the first TFT T1 and transfers a data signal provided from the data line DAm to the inside of the pixel 100 when a scan signal is provided from a scan line SCn. That is, the second TFT T2 functions as a switching transistor of the pixel 100. The second TFT T2 includes a second active layer A2, a second gate electrode G2, a second source electrode S2, and a second drain electrode D2.

The second active layer A2 may include polysilicon, and may include a source region and a drain region, which are doped with a doping material, and a channel region between the source region and the drain region. The second active layer A2 is located between the buffer layer BU and the gate insulation layer GI, which are formed on the substrate SUB.

The second gate electrode G2 of the second TFT T2 may be coupled to the scan line SCn, and may be on the same layer as a layer on which the first gate electrode G1 of the first TFT T1 and the scan line SCn are located (e.g., disposed). That is, the gate insulation layer GI may be between the second gate electrode G2 and the second active layer A2 of the second TFT T2. The second source electrode S2 of the second TFT T2 may be coupled to the data line DAm. The second drain electrode D2 of the second TFT T2 may be coupled to the first gate electrode G1 of the first TFT T1.

Although the first source electrode S1 and the first drain electrode D1 of the first TFT T1 and the second source electrode S2 and the second drain electrode D2 of the second TFT T2 of the organic light-emitting display device according to a first embodiment of the present invention are formed in different layers from the first active layer A1 and the second active layer A2, respectively, embodiments of the present invention are not limited thereto. For example, the first source electrode S1 and the first drain electrode D1 of the first TFT T1 and the second source electrode S2 and the second drain electrode D2 of the second TFT T2 of an organic light-emitting display device according to another embodiment of the present invention may be formed in different layers from the first active layer A1 and the second active layer A2, respectively.

The first capacitor C1 may be used to store the data signal provided to the inside of the pixel 100 during a data programming period, may maintain (or store) the data signal for a frame, and may be coupled to the first power ELVDD and the first gate electrode G1 of the first TFT T1. That is, the first capacitor C1 may function as a storage capacitor. The first capacitor C1 includes the first capacitor electrode CE1 and a second capacitor electrode CE2.

According to an embodiment of the present invention, the first capacitor electrode CE1 is coupled to the above-described first gate electrode G1 of the first TFT T1 through the connection node CNOD formed in the node contact hole NODCNT. The first capacitor electrode CE1 is on (e.g., disposed on) the same layer as the first active layer A1 and the second active layer A2. Additionally, the first capacitor electrode CE1 may be formed of polysilicon doped with a doping material.

The second capacitor electrode CE2 of the first capacitor C1 may be coupled to the driving power line ELVDDL.

The first drain electrode D1 of the first TFT T1 is coupled to the OLED through a via hole VIA.

The OLED includes the anode electrode EL1, which is located on (e.g., disposed on) the first drain electrode D1 (with a planarization layer PL interposed between at least a portion thereof) and is coupled to the first drain electrode D1 through the via hole VIA, an emissive layer EL, and the cathode electrode E2 coupled to the second power source ELVSS. A location of the emissive layer EL may be defined by a pixel definition layer PDL. The cathode electrode EL2 may be located (e.g., disposed) on the pixel definition layer PDL.

Referring to FIGS. 1 and 2, the gate insulation layer GI is between the first capacitor electrode CE1 of the first capacitor C1 and the first gate electrode G1 of the first TFT T1, and the interlayer insulation layer ILD is between at least a portion of the first gate electrode G1 of the first TFT T1 and at least a portion of the connection node CNOD.

The first capacitor electrode CE1 of the first capacitor C1 is coupled to the connection node CNOD through a first contact hole CNT1 in (e.g., formed in) the gate insulation layer GI and the interlayer insulation layer ILD. The first gate electrode G1 of the first TFT T1 is coupled to the connection node CNOD through a second contact hole CNT2 in (e.g., formed in) the interlayer insulation layer ILD. That is, although the first capacitor electrode CE1 of the first capacitor C1 and the first gate electrode G1 of the first TFT T1 are in (e.g., formed in) different layers, they are coupled to each other through the same connection node CNOD.

According to one or more embodiments of the present invention, the first contact hole CNT1 and the second contact hole CNT2 are not separated from each other by the gate insulation layer GI or the interlayer insulation layer ILD, but form one, united node contact hole NODCNT. That is, the node contact hole NODCNT is integrally formed without a bank of the gate insulation layer GI or the interlayer insulation layer ILD.

The first capacitor electrode CE1 of the first capacitor C1 and the first gate electrode G1 of the first TFT T1 may include a partially overlapping region OL at the region where the node contact hole NODCNT is located. According to one or more embodiments of the present invention, the interlayer insulation layer ILD is not formed in the partially overlapping region OL.

If, alternatively, the first contact hole CNT1 and the second contact hole CNT2, which form the node contact hole NODCNT, are separated, an insulation layer is then formed as a bank between the first contact hole CNT1 and the second contact hole CNT2. However, since the first contact hole CNT1 and the second contact hole CNT2 according to the embodiments of the present invention are not separated from each other, but instead, are integrally formed, no bank is formed between the first contact hole CNT1 and the second contact hole CNT2, which reduces a design margin for forming the bank when a pixel is designed, thereby maximizing a space utilization. Such reduced space may be used to increase an area of a capacitor, thereby implementing a high resolution pixel design.

Figure 5:
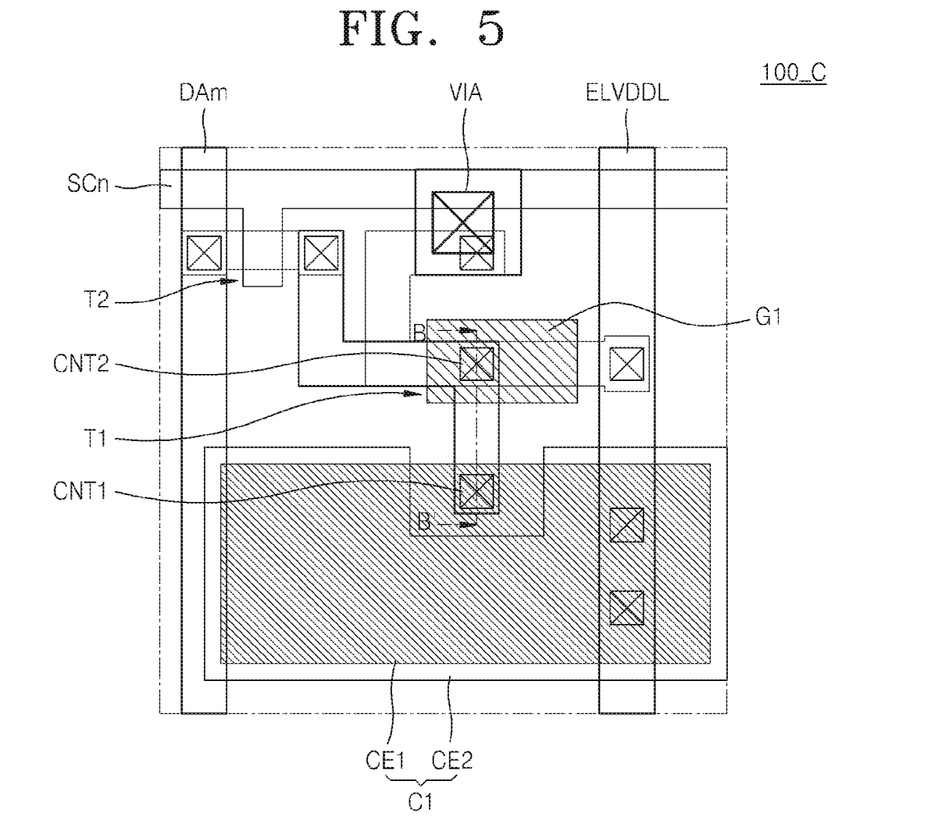
FIG. 5 is a schematic plan view of a pixel of an organic light-emitting display device according to a first comparison example.
Figure 6:
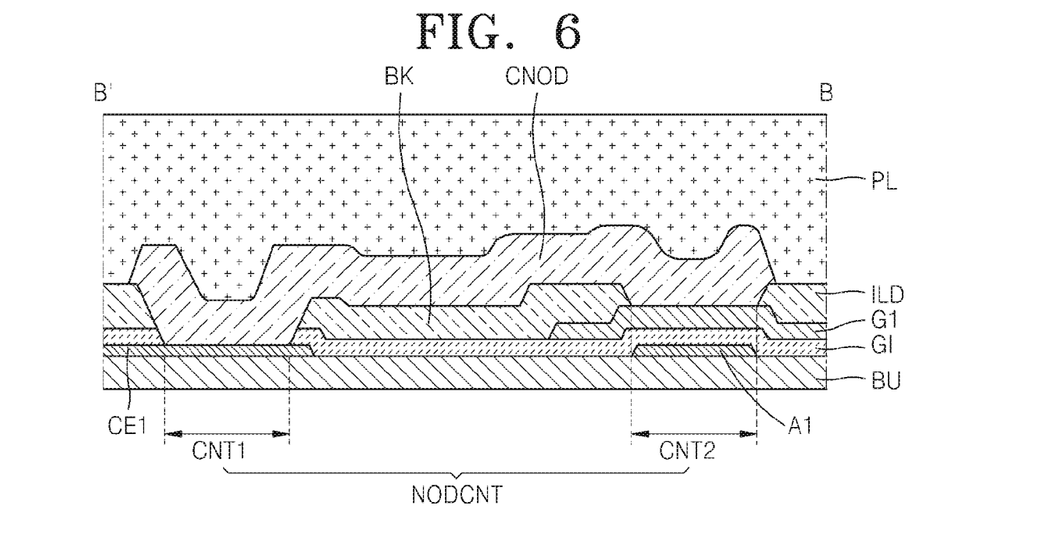
FIG. 6 is a schematic cross-sectional view of the line B-B' of FIG. 5.

An organic light-emitting display device according to a first comparison example will now be described. FIG. 5 is a schematic plan view of a pixel 100_C of an organic light-emitting display device according to a first comparison example. FIG. 6 is a schematic cross-sectional view of the line B-B' of FIG. 5.

Referring to FIGS. 5 and 6, while the pixel 100_C of the organic light-emitting display device includes two TFTs T1 and T2 and one capacitor C1 like the first embodiment of the present invention, there is a difference in the node contact hole NODCNT. The difference in the node contact hole NODCNT between the first embodiment and the first comparison example will now be described.

In the first comparison example, the first capacitor electrode CE1 of the first capacitor C1 and the first gate electrode G1 of the first TFT T1 do not overlap but are separated from each other.

The first capacitor electrode CE1 of the first capacitor C1 is coupled to the connection node CNOD through the first contact hole CNT1, which is in the gate insulation layer GI and the interlayer insulation layer ILD.

The gate insulation layer GI is between the first active layer A1 and the first gate electrode G1 of the first TFT T1. The interlayer insulation layer ILD is between the first gate electrode G1 and the connection node CNOD. The first gate electrode G1 is coupled to the connection node CNOD through the second contact hole CNT2, which is in the interlayer insulation layer ILD.

In the first comparison example, unlike the above-described first embodiment, the first contact hole CNT1 and the second contact hole CNT2 are not united into one contact hole, but instead, a bank BK is between the first contact hole CNT1 and the second contact hole CNT2, and is on the first gate electrode G1 and the gate insulating layer GI such that portions of the node contact hole NODCNT are separated by the bank BK. Thus, a design margin may be allocated to form an insulation layer as the bank BK between the first contact hole CNT1 and the second contact hole CNT2 and space utilization may be restricted when a pixel is designed. Accordingly, because of the space restriction, a large area of a capacitor may not be designed, which is disadvantageous to high resolution pixel design.

An organic light-emitting display device according to a second embodiment of the present invention will now be described with reference to FIGS. 7 through 10.

Figure 7:
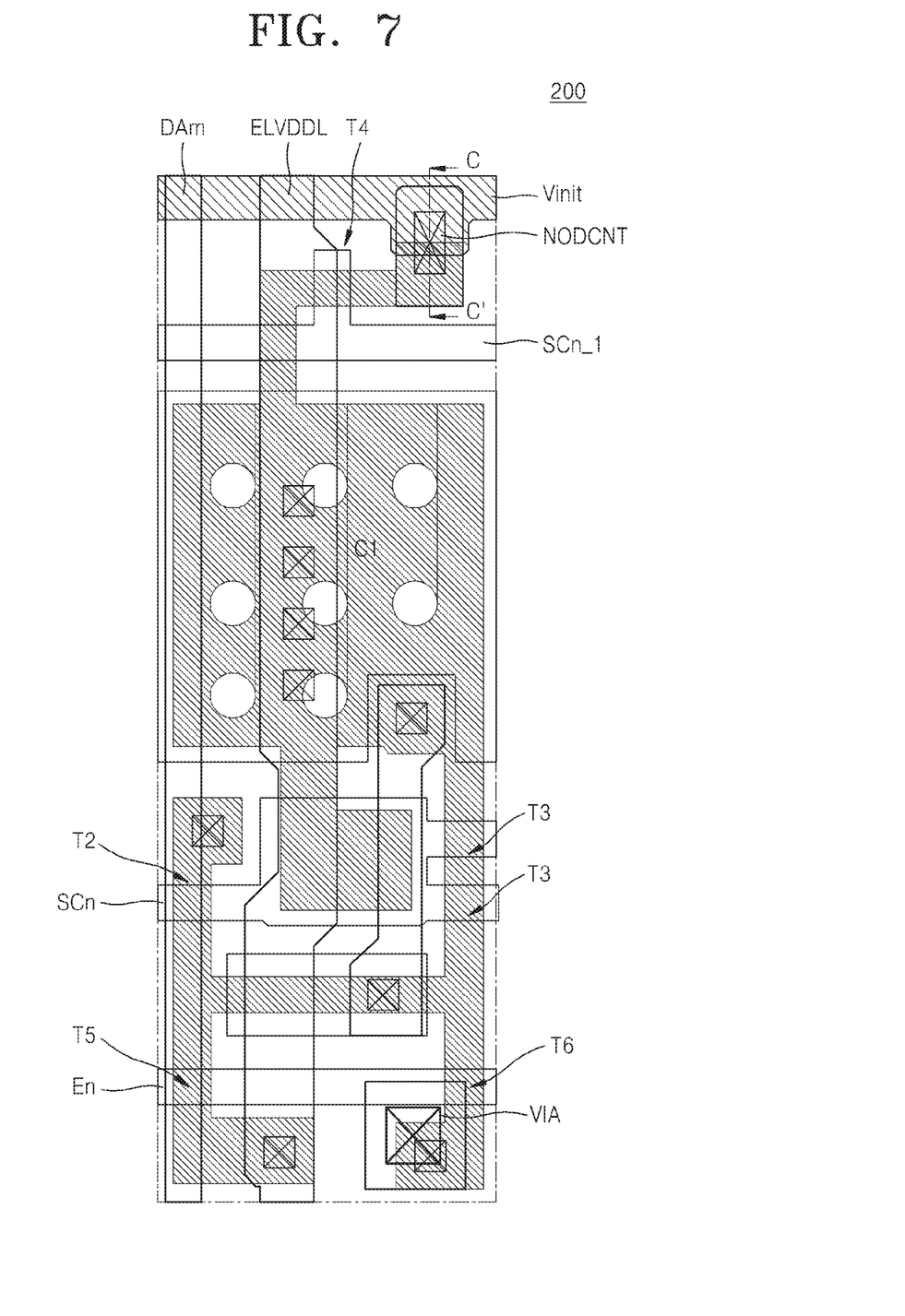
FIG. 7 is a schematic plan view of a pixel of an organic light-emitting display device according to a second embodiment of the present invention.
Figure 8:
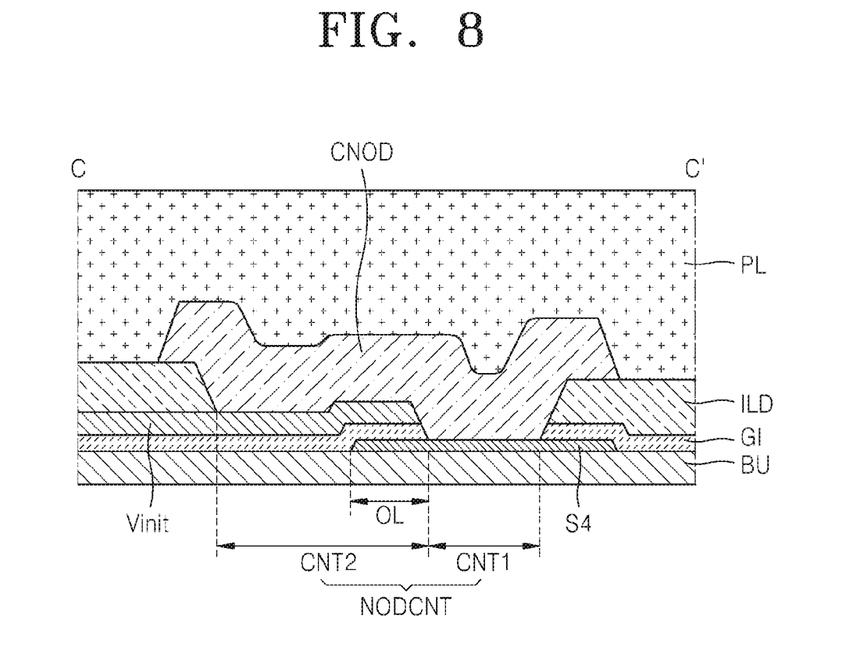
FIG. 8 is a schematic cross-sectional view of the line C-C' of FIG. 7.
Figure 9:
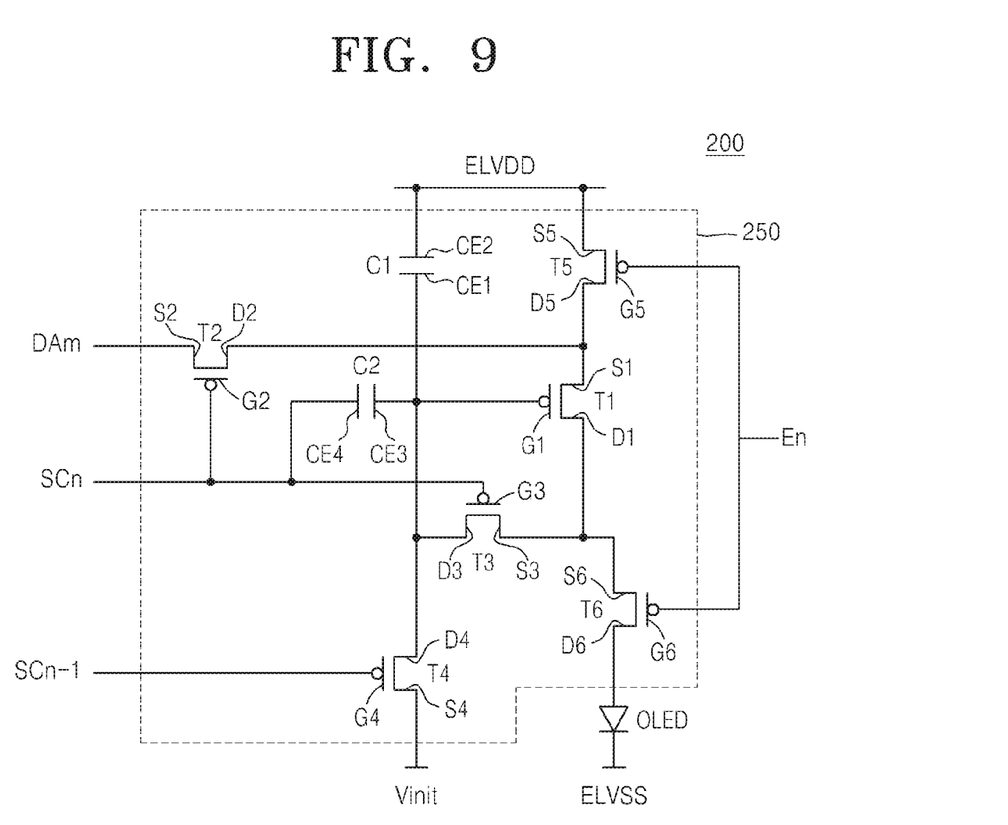
FIG. 9 is a circuit diagram of the pixel of FIG. 7.
Figure 10:
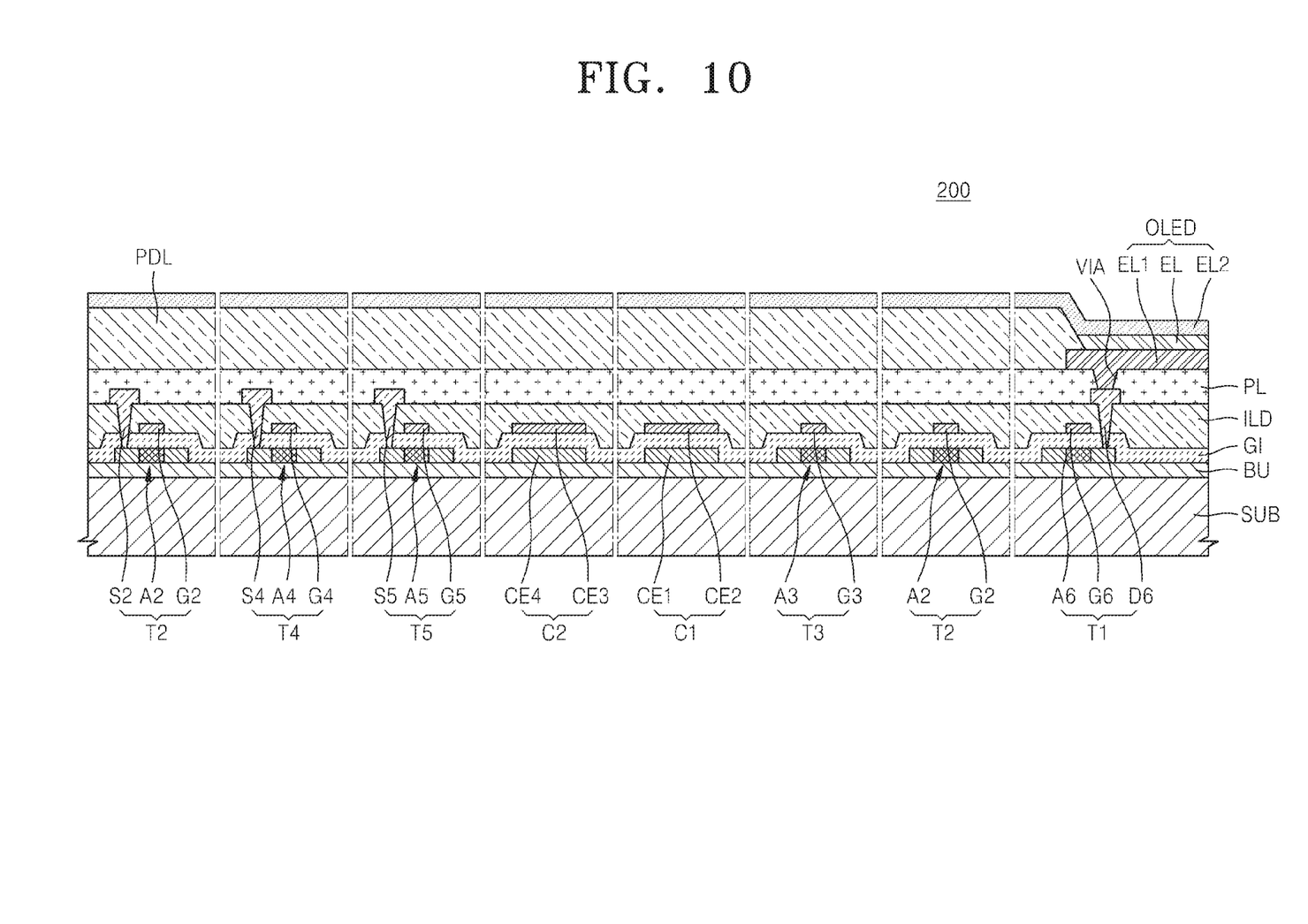
FIG. 10 is a cross-sectional diagram of the pixel of FIG. 7.

FIG. 7 is a schematic plan view of a pixel 200 of an organic light-emitting display device according to a second embodiment of the present invention. FIG. 8 is a schematic cross-sectional view of the line C-C' of FIG. 7. FIG. 9 is a circuit diagram of the pixel 200 of FIG. 7. FIG. 10 is a cross-sectional diagram of the pixel 200 of FIG. 7.

Referring to FIGS. 7 through 10, the pixel 200 of the organic light-emitting display device according to a second embodiment of the present invention includes six TFTs and two capacitors.

A pixel circuit 250 includes the first TFT T1, the second TFT T2, a third TFT T3, a fourth TFT T4, a fifth TFT T5, a sixth TFT T6, the first capacitor C1, and the second capacitor C2.

The first TFT T1 is coupled between the driving power line ELVDDL and the OLED and supplies the driving power corresponding to a data signal from the first power source ELVDD to the OLED during a light emitting period of the pixel 200. That is, the first TFT T1 functions as a driving transistor of the pixel 200. The first TFT T1 includes the first active layer A1, the first gate electrode G1, the first source electrode S1, and the first drain electrode D1.

The first active layer A1 of the first TFT T1 may include polysilicon, and may include a source region and a drain region, which are doped with a doping material, and a channel region between the source region and the drain region. The first active layer A1 may be between the buffer layer BU and the gate insulation layer GI, which are formed on a substrate SUB.

The first gate electrode G1 of the first TFT T1 may be coupled to the first capacitor electrode CE1 of the first capacitor C1, and may be on (e.g., disposed on) the same layer as the first scan line SCn, a second scan line SCn-1, and an initialization power line Vinit. The first source electrode S1 of the first TFT T1 may be coupled to the driving power line ELVDDL via the fifth TFT T5. The first drain electrode D1 of the first TFT T1 may be coupled to the OLED via the sixth TFT T6.

The second TFT T2 may be coupled between the data line DAm and the first TFT T1, and may transfer a data signal provided from the data line DAm to the inside of the pixel 200 when a scan signal is provided from the second scan line SCn-1. That is, the second TFT T2 functions as a switching transistor of the pixel 200. The second TFT T2 includes the second active layer A2, the second gate electrode G2, the second source electrode S2, and the second drain electrode D2.

The second active layer A2 of the second TFT T2 may include polysilicon, and may include a source region and a drain region, which are doped with a doping material, and a channel region between the source region and the drain region. The second active layer A2 may be between the buffer layer BU and the gate insulation layer GI, which are on the substrate SUB. The second gate electrode G2 of the second TFT T2 may be coupled to the first scan line SCn. The second source electrode S2 of the second TFT T2 may be coupled to the data line DAm. The second drain electrode D2 of the second TFT T2 may be coupled to the first source electrode S1 of the first TFT T1.

As illustrated in FIG. 9, the third TFT T3 is coupled between the first drain electrode D1 and the first gate electrode G1 of the first TFT T1 and compensates for a threshold voltage of the first TFT T1 by diode-connecting the first TFT T1 when the data signal is provided to the inside of the pixel 200. That is, the third TFT T3 functions as a compensation transistor of the pixel 200. The third TFT T3 includes the third active layer A3, the third gate electrode G3, the third source electrode S3, and the third drain electrode D3.

The third active layer A3 of the third TFT T3 may include polysilicon, and may include a source region and a drain region, which are doped with a doping material, and a channel region between the source region and the drain region. The third active layer A3 may be between the buffer layer BU and the gate insulation layer GI, which are on the substrate SUB. The third gate electrode G3 of the third TFT T3 may be coupled to the first scan line SCn. The third source electrode S3 of the third TFT T3 may be coupled to the first drain electrode D1 of the first TFT T1. The third drain electrode D3 of the third TFT T3 may be coupled to the first gate electrode G1 of the first TFT T1.

According to the second embodiment of the present invention, the fourth TFT T4 is coupled between the initialization power line Vinit and the first gate electrode G1 of the first TFT T1, transfers initialization power supplied from the initialization power line Vinit to the inside of the pixel 200 when the scan signal is provided from the second scan line SCn-1 during an initialization period before a data programming period (in which the data signal is input into the pixel 200) so that the data signal may be smoothly provided to the inside of the pixel 200 during the data programming period, and initializes the first TFT T1. That is, the fourth TFT T4 functions as a switching transistor of the pixel 200. The fourth TFT T4 includes the fourth active layer A4, the fourth gate electrode G4, the fourth source electrode S4, and the fourth drain electrode D4.

The fourth active layer A4 may include polysilicon, and may include a source region and a drain region, which are doped with a doping material, and a channel region between the source region and the drain region. The fourth active layer A4 may be between the buffer layer BU and the gate insulation layer GI, which are on the substrate SUB. The fourth gate electrode G4 of the fourth TFT T4 may be coupled to the second scan line SCn-1. The fourth source electrode S4 of the fourth TFT T4 may be coupled to the initialization power line Vinit by the connection node CNOD, which is coupled through the node contact hole NODCNT. The fourth source electrode S4 of the fourth TFT T4 is on the same layer as the first through sixth active layers A1 through A6. The fourth source electrode S4 of the fourth TFT T4 may be formed of polysilicon doped with a doping material. The fourth drain electrode D4 of the fourth TFT T4 may be coupled to the first gate electrode G1 of the first TFT T1.

In the second embodiment of the present invention, the fifth TFT T5 is coupled between the driving power line ELVDDL and the first TFT T1, blocks a connection between the first power ELVDD and the first TFT T1 during a non-emissive period of the pixel 200, and couples the first power ELVDD to the first TFT T1 during an emissive period of the pixel 200. That is, the fifth TFT T5 functions as a switching transistor of the pixel 200. The fifth TFT T5 includes the fifth active layer A5, the fifth gate electrode G5, the fifth source electrode S5, and the fifth drain electrode D5.

The fifth active layer A5 may include polysilicon, and may include a source region and a drain region, which are doped with a doping material, and a channel region between the source region and the drain region. The fifth active layer A5 may be between the buffer layer BU and the gate insulation layer GI, which are on the substrate SUB. The fifth gate electrode G5 of the fifth TFT T5 may be coupled to an emissive control line En. The fifth source electrode S5 of the fifth TFT T5 may be coupled to the driving power line ELVDDL. The fifth drain electrode D5 of the fifth TFT T5 may be coupled to the first source electrode S1 of the first TFT T1.

The sixth TFT T6 is coupled between the first TFT T1 and the OLED, blocks a connection between the first TFT T1 and the OLED during the non-emissive period of the pixel 200, and couples the first TFT T1 to the OLED during the emissive period of the pixel 200. That is, the sixth TFT T6 functions as a switching transistor of the pixel 200. The sixth TFT T6 includes the sixth active layer A6, the sixth gate electrode G6, the sixth source electrode S6, and the sixth drain electrode D6.

The sixth active layer A6 may include polysilicon, and may include a source region and a drain region, which are doped with a doping material, and a channel region between the source region and the drain region. The sixth active layer A6 may be between the buffer layer BU and the gate insulation layer GI, which are on the substrate SUB. The sixth gate electrode G6 of the sixth TFT T6 may be coupled to the emissive control line En. The sixth source electrode S6 of the sixth TFT may be coupled to the first drain electrode D1 of the first TFT T1. The sixth drain electrode D6 of the sixth TFT T6 may be coupled to an anode electrode of the OLED.

Although the second source electrode S2 of the second TFT T2, the fourth source electrode S4 of the fourth TFT T4, and the fifth source electrode S5 of the fifth TFT T5 of the organic light-emitting display device according to the second embodiment of the present invention (as illustrated in FIG. 7) are formed in different layers from the second active layer A2, the fourth active layer A4, and the fifth active layer A5, respectively, this does not mean that the second source electrode S2, the fourth source electrode S4, and the fifth source electrode S5 may not be selectively formed in the same layers as the second active layer A2, the fourth active layer A4, and the fifth active layer A5, respectively. That is, the second source electrode S2, the fourth source electrode S4, and the fifth source electrode S5 may be selectively formed in the same layers as the second active layer A2, the fourth active layer A4, and the fifth active layer A5, respectively.

When the second source electrode S2, the fourth source electrode S4, and the fifth source electrode S5, which are selectively formed in the same layers as the second active layer A2, the fourth active layer A4, and the fifth active layer A5, respectively, are coupled to conductive layers formed in layers different from the second active layer A2, the fourth active layer A4, and the fifth active layer A5 through contact holes, the conductive layers may include (or form or define) the second source electrode S2, the fourth source electrode S4, and the fifth source electrode S5.

For example, in FIGS. 7 and 8, although the fourth source electrode S4 is in the same layer as the fourth active layer A4 and is coupled to the connection node CNOD in a layer different from the fourth active layer A4 through the node contact hole NODCNT, a part of the connection node CNOD includes (or forms or defines) the fourth source electrode S4 in FIG. 10 because the connection node CNOD and the fourth source electrode S4 formed in the fourth active layer A4 are electrically and functionally identical to each other.

In the second embodiment of the present invention, the first capacitor C1 is used to store the data signal provided to the inside of the pixel 200 during a data programming period and to maintain the data signal for a frame, and is coupled between the driving power line ELVDDL (which is coupled to the first power ELVDD) and the first gate electrode G1 of the first TFT T1 (which is coupled to the initialization power line Vinit). That is, the first capacitor C1 functions as a storage capacitor. The first capacitor C1 includes the first capacitor electrode CE1 and the second capacitor electrode CE2. The first capacitor electrode CE1 of the first capacitor C1 is coupled to the first gate electrode G1 of the first TFT T1 (which is coupled to the initialization power line Vinit). The second capacitor electrode CE2 is coupled to the driving power line ELVDDL.

The second capacitor C2 is used to compensate for a voltage drop due to a load in the organic light-emitting display device and is coupled between the first capacitor electrode CE1 of the first capacitor C1 and the first scan line SCn. That is, when a voltage level of a current scan signal changes (for example, changes at the time when the current scan signal is stopped being provided), the second capacitor C2 functions as a boosting capacitor that compensates for the voltage drop due to the load in the organic light-emitting display device by increasing a voltage of the first gate electrode G1 of the first TFT T1 owing to a coupling function. The second capacitor C2 includes a third capacitor electrode CE3 and a fourth capacitor electrode CE4.

The third capacitor electrode CE3 of the second capacitor C2 is coupled to the first capacitor electrode CE1 of the first capacitor C1. The fourth capacitor electrode CE4 of the second capacitor C2 is coupled to the first scan line SCn.

The OLED is coupled to the sixth drain electrode D6 of the sixth TFT T6 through the via hole VIA.

The OLED includes the anode electrode EL1, which is located on (e.g., disposed on) the sixth drain electrode D6 (with a planarization layer PL interposed between at least a portion thereof) and is coupled to the sixth drain electrode D6 through the via hole VIA, the emissive layer EL, and the cathode electrode E2 coupled to the second power source ELVSS. The location of the emissive layer EL may be defined by the pixel definition layer PDL. The cathode electrode EL2 may be arranged (e.g., disposed) on (e.g., covering) the pixel definition layer PDL.

Referring to FIGS. 7 and 8, the gate insulation layer GI may be between the initialization power line Vinit and the fourth source electrode S4 of the fourth TFT T4, and the interlayer insulation layer ILD may be between the initialization power line Vinit and a portion of the connection node CNOD.

According to the second embodiment of the present invention, the initialization power line Vinit is coupled to the connection node CNOD through the first contact hole CNT1 formed in the interlayer insulation layer ILD. Also, the fourth source electrode S4 of the fourth TFT T4 is coupled to the connection node CNOD through the second contact hole CNT2 formed in the gate insulation layer GI and the interlayer insulation layer ILD. That is, although the initialization power line Vinit and the fourth source electrode S4 may be formed in different layers, they are coupled to each other through the same connection node CNOD.

In this regard, the first contact hole CNT1 and the second contact hole CNT2 are not separated from each other by the gate insulation layer GI or the interlayer insulation layer ILD, but instead, form one, united node contact hole NODCNT. That is, the node contact hole NODCNT is integrally formed without a bank being adjacent to the gate insulation layer GI or the interlayer insulation layer ILD.

The initialization power line Vinit and the fourth source electrode S4 of the fourth TFT T4 have a partially overlapping region OL at a region where the node contact hole NODCNT is formed. The interlayer insulation layer ILD is not formed in the partially overlapping region OL.

By comparison, if the first contact hole CNT1 and the second contact hole CNT2 are separated, an insulation layer is formed as a bank between the first contact hole CNT1 and the second contact hole CNT2. However, since the first contact hole CNT1 and the second contact hole CNT2 according to the embodiments of the present invention are not separated from each other, but instead, are integrally formed, no bank is formed between the first contact hole CNT1 and the second contact hole CNT2, which reduces a design margin when a pixel is designed, thereby maximizing (or increasing) a space utilization. Such reduced space may be used to increase an area of a capacitor, thereby implementing a high resolution pixel design.

Figure 11:
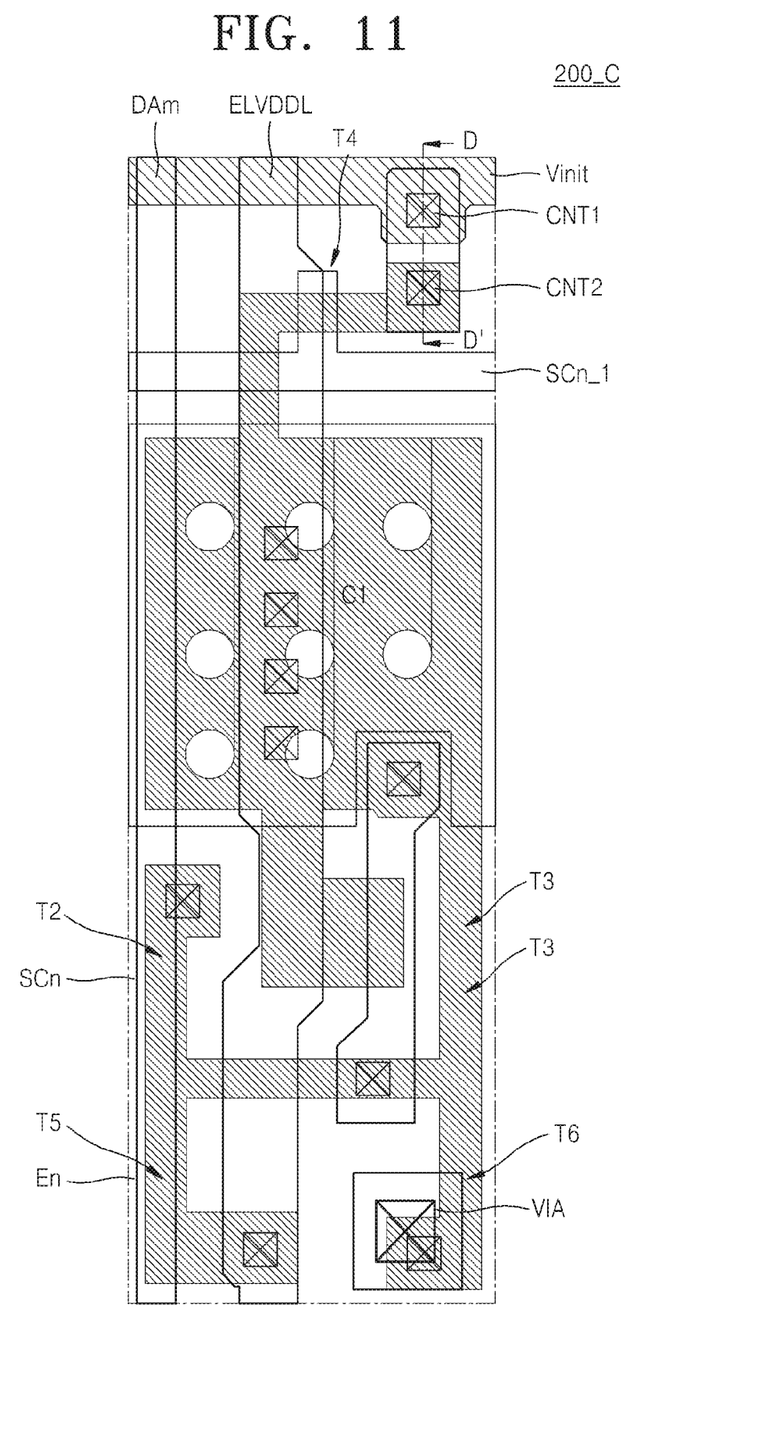
FIG. 11 is a schematic plan view of a pixel of an organic light-emitting display device according to a second comparison example.
Figure 12:
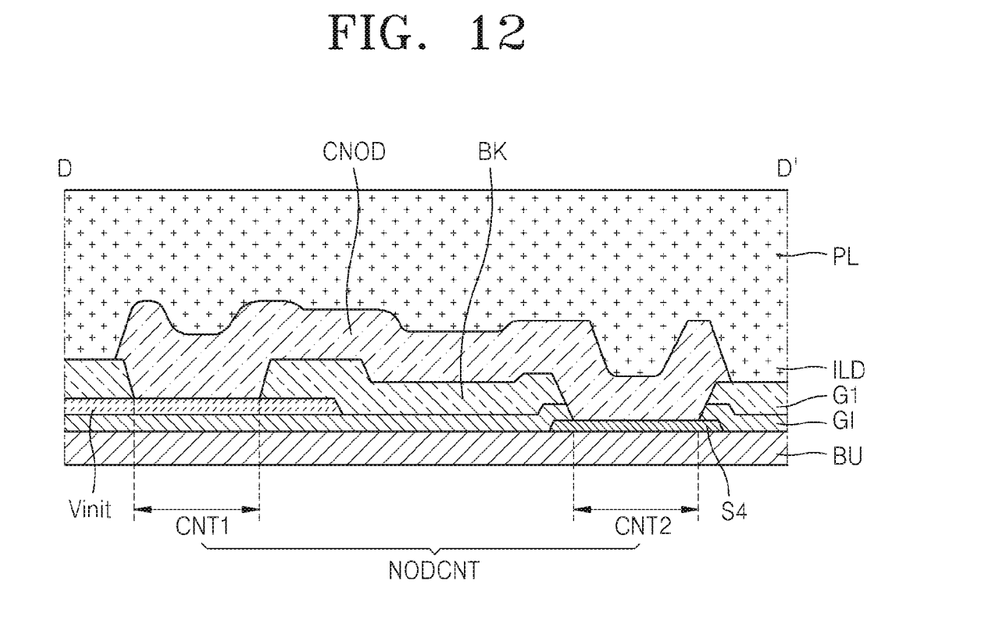
FIG. 12 is a schematic cross-sectional view of the line D-D' of FIG. 11.

An organic light-emitting display device according to a second comparison example will now be described. FIG. 11 is a schematic plan view of a pixel 200_C of an organic light-emitting display device according to a second comparison example. FIG. 12 is a schematic cross-sectional view of the line D-D' of FIG. 11.

Referring to FIGS. 11 and 12, while the pixel 200_C of the organic light-emitting display device includes the six TFTs T1 through T6 and the two capacitors C1 and C2 like the second embodiment of the present invention, there is a difference in the node contact hole NODCNT. The difference in the node contact hole NODCNT between the second embodiment and the second comparison example will now be described.

In the comparison example of FIGS. 11 and 12, the initialization power line Vinit and the fourth source electrode S4 of the fourth TFT T4 do not overlap but are separated from each other. The initialization power line Vinit is coupled to the connection node CNOD through the first contact hole CNT1 formed in the interlayer insulation layer ILD.

The gate insulation layer GI and the interlayer insulation layer ILD are formed between the fourth source electrode S4 of the fourth TFT T4 and the connection node CNOD. The fourth source electrode S4 is coupled to the connection node CNOD through the second contact hole CNT2 formed in the gate insulation layer GI and the interlayer insulation layer ILD.

Accordingly, like the above-described second embodiment of the present invention, the first contact hole CNT1 and the second contact hole CNT2 are not united into one contact hole, but instead, a bank BK is between the first contact hole CNT1 and the second contact hole CNT2 and is on the gate insulating layer GI and the initialization power line Vinit so that the node contact hole NODCNT is separated (or divided) by the bank BK. Thus, a design margin is allocated to form an insulation layer as the bank BK between the first contact hole CNT1 and the second contact hole CNT2, and a space utilization is restricted when a pixel is designed. Due to the space restriction, a large area for a capacitor may not be designed, which is disadvantageous in high resolution pixel design.

Although the integrated node contact hole NODCNT is formed between the first gate electrode G1 and the first capacitor electrode CE1 in the above-described first embodiment, and the integrated node contact hole NODCNT is formed between the fourth source electrode S4 and the initialization power line Vinit in the above-described second embodiment, these are only parts of the embodiments and the present invention is not limited thereto. Thus, the present invention may be applied in a case where conductive layers formed in different layers are coupled through an integrated contact hole, as described in the above embodiments, between adjacent devices or wires.

According to a thin-film transistor array substrate and a display device including the thin-film transistor array substrate of the present invention described above, a node contact hole is not separated by an insulation layer but is integrally formed, which may reduce a design margin compared to a node contact hole that is separately formed, thereby maximizing a space utilization and achieving a high resolution pixel design.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A thin-film transistor (TFT) array substrate comprising:
a first conductive layer;
a first insulating layer disposed on the first conductive layer and comprising a first opening;
a second conductive layer disposed on the first insulating layer;
a second insulating layer disposed on the second conductive layer and comprising a second opening; and
a third conductive layer disposed on the second insulating layer,
wherein the third conductive layer extends through the first opening and the second opening to directly contact the first conductive layer, and the third conductive layer extends through the second opening to directly contact the second conductive layer,
wherein the first conductive layer does not overlap the entire second opening,
wherein the first conductive layer and the second conductive layer are not in direct contact with each other in the second opening, and
wherein the first opening and the second opening overlap each other in a cross-sectional view.

2. The TFT array substrate of claim 1, wherein the third conductive layer covers the entire second opening.

3. The TFT array substrate of claim 1, wherein the third conductive layer covers the entire first opening.

4. The TFT array substrate of claim 1, wherein a size of the second opening is larger than a size of the first opening in a plan view.

5. The TFT array substrate of claim 4, wherein a portion of a surface of the first insulating layer forming the first opening is connected to a portion of a surface of the second insulating layer forming the second opening without a step.

6. A thin-film transistor (TFT) array substrate comprising:
a first conductive layer;
a first insulating layer disposed on the first conductive layer and comprising a first opening;
a second conductive layer disposed on the first insulating layer;
a second insulating layer disposed on the second conductive layer and comprising a second opening;
a third conductive layer disposed on the second insulating layer; and
a TFT comprising an active layer, a gate electrode on the active layer, a source and drain electrodes on the active layer,
wherein the first conductive layer and the second conductive layer are not in direct contact with each other in the second opening,
wherein the first conductive layer is disposed on the same layer as a layer on which the active layer is formed,
wherein the third conductive layer extends through the first opening and the second opening to directly contact the first conductive layer, and the third conductive layer extends through the second opening to directly contact the second conductive layer, and
wherein the first conductive layer does not overlap the entire second opening.

7. The TFT array substrate of claim 6, wherein the third conductive layer is disposed on the same layer as a layer on which a data wire is formed, the data wire providing a data signal.

8. The TFT array substrate of claim 6, wherein the first conductive layer comprises a same material as the active layer.

9. The TFT array substrate of claim 8, wherein the first conductive layer comprises doped polysilicon.

10. The TFT array substrate of claim 6, wherein the second conductive layer is disposed on the same layer as a layer on which the gate electrode is formed.

11. The TFT array substrate of claim 10, wherein the second conductive layer comprises a same material as the gate electrode.

12. The TFT array substrate of claim 10, wherein the second conductive layer is disposed on the same layer as a layer on which a scan wire is formed, the scan wire providing a scan signal.

* * * * *